United States Patent
Schremmer et al.

(10) Patent No.: US 6,842,336 B2
(45) Date of Patent: Jan. 11, 2005

(54) PORTABLE ELECTRONIC DEVICE WITH CARRIER PLATE

(75) Inventors: Andreas Schremmer, Schomdorf (DE); Tobias Schimmele-Brell, Weinstadt (DE); Gerhard Geiselmann, Heehdorf (DE); Werner Pfitzenreiter, Lorch (DE); Iain Thomas Learmonth, Basingstoke (GB)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 331 days.

(21) Appl. No.: 10/082,876

(22) Filed: Feb. 25, 2002

(65) Prior Publication Data

US 2002/0114130 A1 Aug. 22, 2002

(30) Foreign Application Priority Data

Aug. 27, 1999 (DE) ......................................... 199 40 695

(51) Int. Cl.[7] .............................................. H05K 5/00
(52) U.S. Cl. .................... 361/683; 364/708.1; 235/462; 312/223.3
(58) Field of Search ................................ 361/679–686; 364/708.1, 709.1, 709.12, 707; 235/462, 472, 486, 385; 312/223.1–223.6

(56) References Cited

U.S. PATENT DOCUMENTS 5,420,759 A  5/1995 Charlier et al. ............. 361/814
5,805,416 A * 9/1998 Friend et al. ............... 361/686
5,969,328 A * 10/1999 Kunert ................... 235/472.01
6,646,866 B2 * 11/2003 Kao ........................... 361/683

FOREIGN PATENT DOCUMENTS

| | | |
|---|---|---|
| DE | 31330 | 1/1965 |
| DE | OS2031734 | 12/1971 |
| DE | GM7327047 | 10/1973 |
| DE | G9116755.8 | 12/1993 |
| DE | 4415200 C1 | 8/1995 |
| EP | 0702325 A2 | 3/1996 |
| EP | 0702460 A2 | 3/1996 |
| GB | 2321619 A | 8/1998 |
| WO | WO96/10899 | 4/1996 |
| WO | WO97/39418 | 10/1997 |

* cited by examiner

*Primary Examiner*—Hung Van Duong
(74) *Attorney, Agent, or Firm*—Roger C. Turner

(57) ABSTRACT

A hand-held electrical device (10) such as a mobile telephone, includes a carrier (11) formed by a thick (over 2 mm) plate of insulative material having a plurality of recesses that receive electronic components. The periphery of the carrier forms most of the periphery of the electronic device. A circuit board (52) with traces thereon lies facewise adjacent to a face of the carrier. Electronic components lying in recesses of the carrier, are connected by resilient blades to conductive traces on the circuit board.

14 Claims, 6 Drawing Sheets

PORTABLE ELECTRONIC DEVICE WITH CARRIER PLATE

CROSS-REFERENCE TO RELATED APPLICATION

This is a continuation-in-part of PCT application PCT/EP00/06019 which names the United States and which claims priority from German Application 199 40 695.2 filed Aug. 27, 1999.

BACKGROUND OF THE INVENTION

Hand-held electronic devices such as mobile telephones, hand-held and palm-type computers and the like generally have a circuit board and several circuit components mounted thereon, such as a switch, an antenna connector, a microphone and a speaker. Mobile phones used in Europe and suggested for use in the United States, also may have smart card readers that receive smart cards such as SIM type or MMC type smart cards. Such smart card each have an active face with conductive pads that connect to an integrated circuit embedded in the card. Previously, such circuit components have generally been mounted on the circuit board, with terminals soldered to conductive traces on the circuit board. This arrangement has some disadvantages. One disadvantage is that the circuit components must be made of material that can withstand the high temperatures of mass soldering, especially where surface mount soldering is used. Heavier components held to the circuit board by a few solder connections and cantilevered above the circuit board, may be jarred lose when the device such as a telephone is dropped. A hand-held electronic device which had circuit components securely held in place and which avoided the need to subject the components to the high temperatures of wave soldering and the like, would be of value.

SUMMARY OF THE INVENTION

In accordance with one embodiment of the present invention, a hand-held electronic device is provided, of the type that includes a plurality of circuit components that require connections, wherein the components are securely held and wherein electrical connections can be made without requiring that the components be subjected to high temperatures of wave soldering and the like. The electronic device includes a thick carrier plate formed of insulative material and having upper and lower carrier faces. The carrier has a plurality of recesses, and a plurality of electronic components are each mounted in a recess. The thick plate carrier extends over most of the area of the device as seen in a plan view.

The circuit components mounted in the carrier have terminals formed by resilient blades that project slightly beyond a face of a carrier. A circuit board that lies facewise against a face of a carrier, has conductive traces thereon that engage the resilient blades of the components to make connections to the components. Alternately, thin connectors with resilient blades are mounted on the circuit board and connected to circuit board traces, and the blades engage rigid terminals of the components mounted in the carrier.

The novel features of the invention are set forth with particularity in the appended claims. The invention will be best understood from the following description when read in conjunction with the accompanying drawings.

DESCRIPTION OF THE PREFERRED EMBODIMENTS

Figure 5:
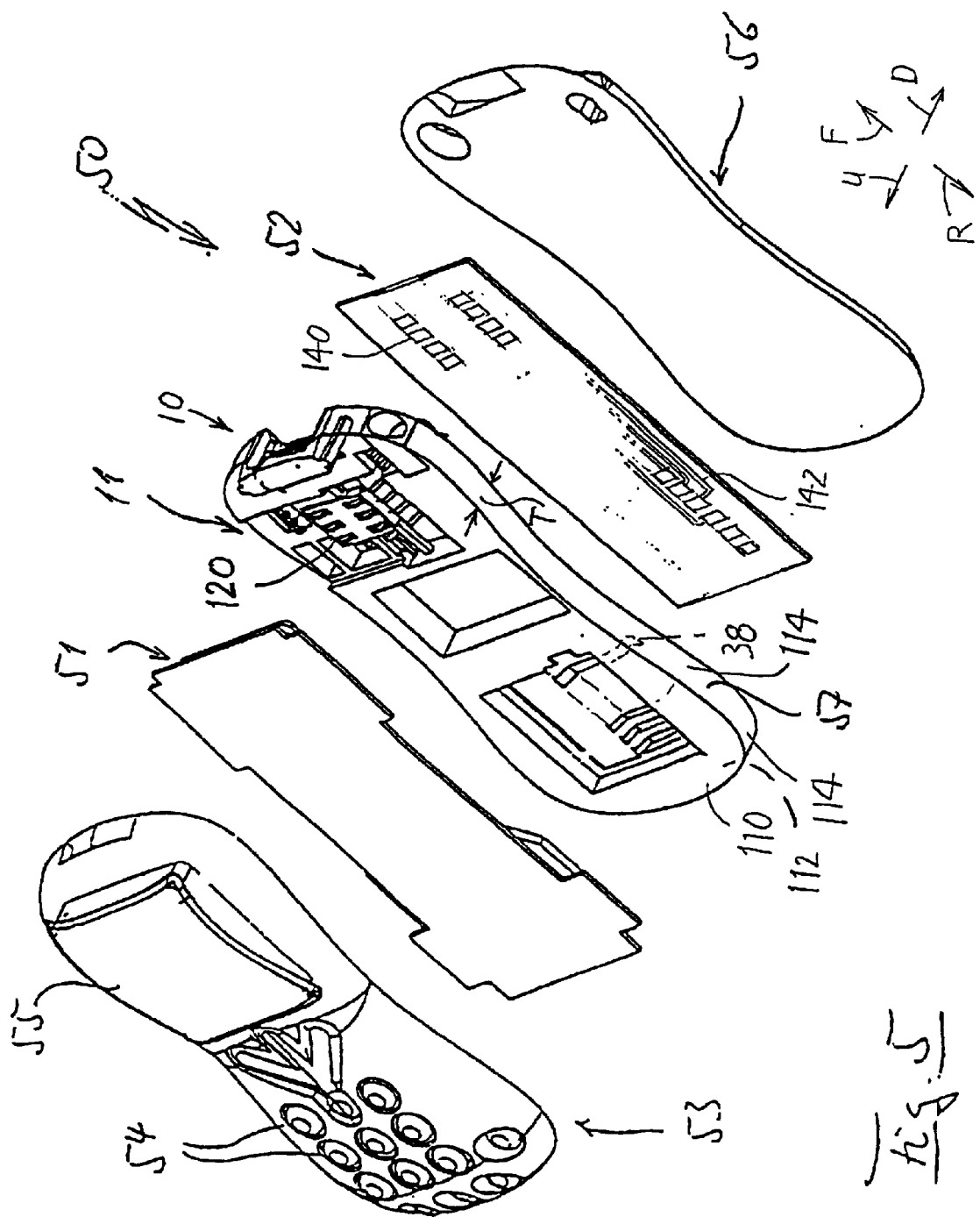
FIG. 5 is an exploded top isometric view of a hand-held electronic device of the present invention, which includes a carrier with components similar to the carrier with components of FIG. 3.

FIG. 5 illustrates a mobile telephone 50 of the present invention, which includes a carrier assembly 10, a pair of circuit boards 51, 52, a top casing shell 53, and a lower casing shell 56. The circuit boards 51, 52 are of the typical thin size of about 0.8 mm for circuit boards used in portable devices such as the telephone 50 having a width of about 8 cm and a length about the twice the width. The carrier assembly 10 includes a carrier 11 formed by a thick electrically insulative plate. The carrier 11 has a thickness T more than twice that of each circuit board, such as a thickness of about 5 mm to accept various circuit components. The carrier is formed of a high strength plastic and is the major structure member of the mobile telephone. The circuit components are mounted in the carrier. The top shell 53 has a display 55 and keyboard 54, while the bottom casing shell 56 is thin and serves to close the bottom of the hand-held device.

Figure 1:
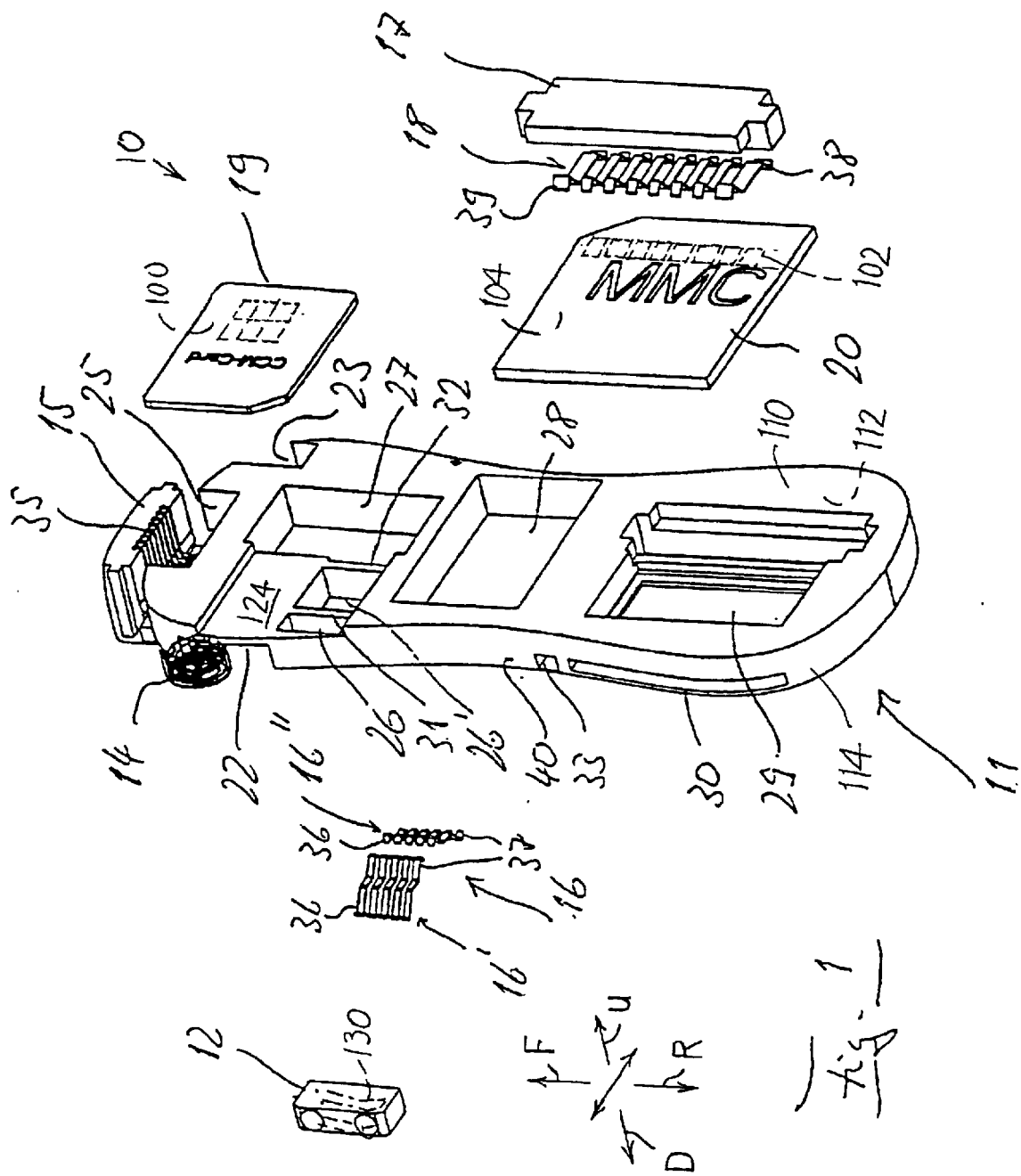
FIG. 1 is a top exploded isometric view of a carrier, circuit components that mount in recesses of the carrier, and two types of smart cards that are designed to be inserted and withdrawn from the carrier.
Figure 2:
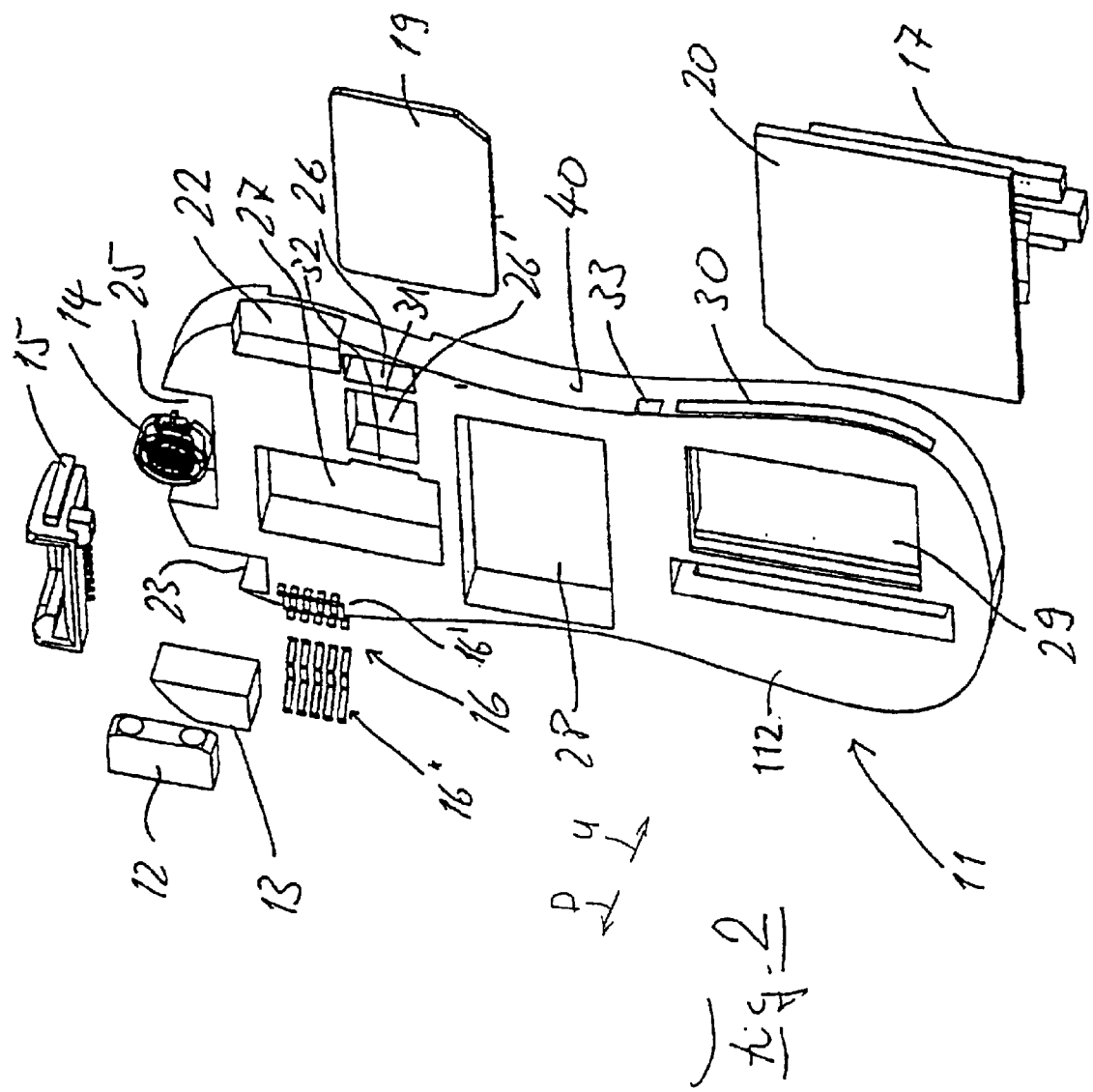
FIG. 2 is an exploded bottom isometric view of the carrier, circuit components, and smart cards of FIG. 1.
Figure 3:
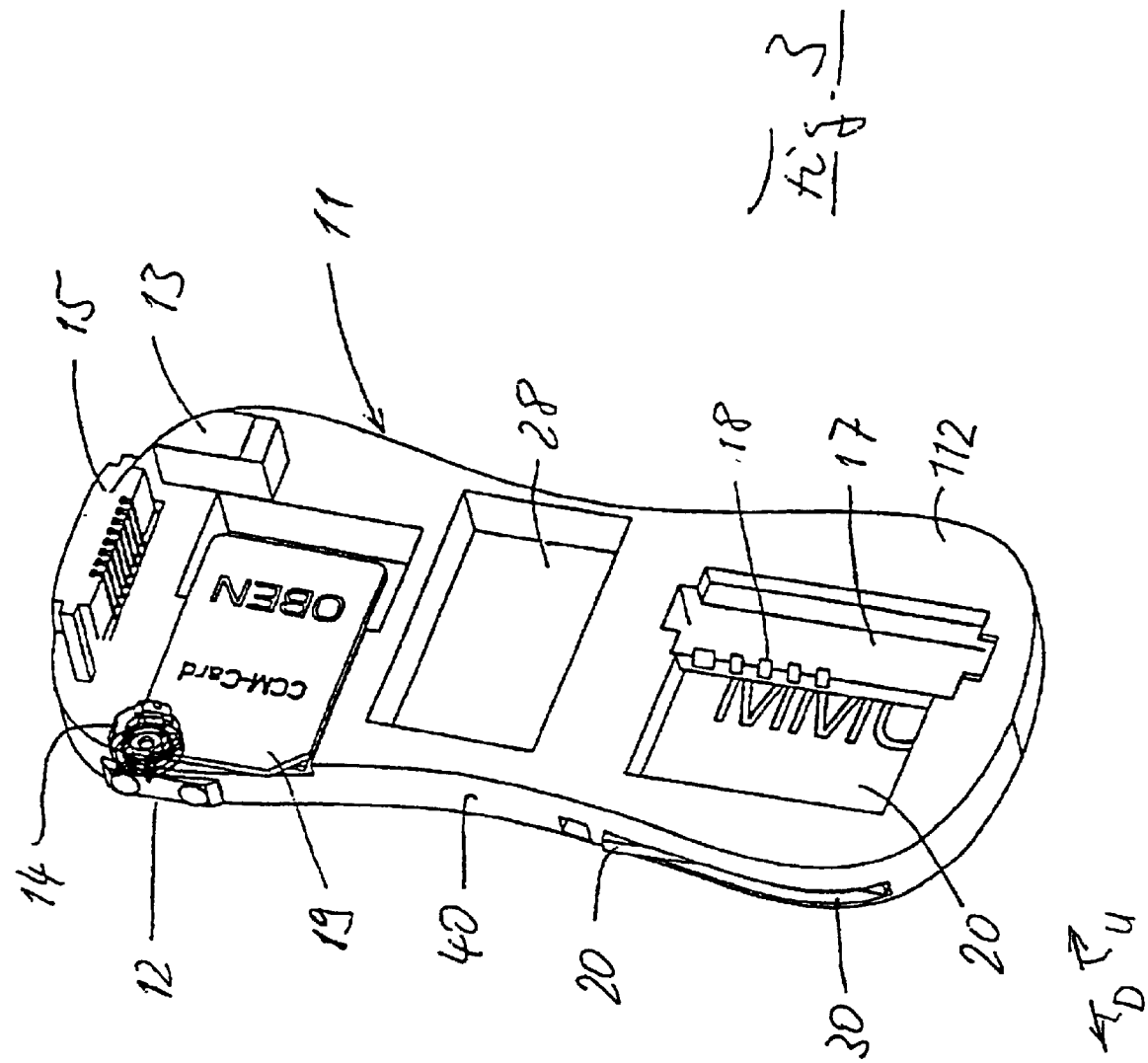
FIG. 3 is a top isometric view of a carrier of FIG. 1, with the components in place and the smart cards in their fully installed positions.
Figure 4:
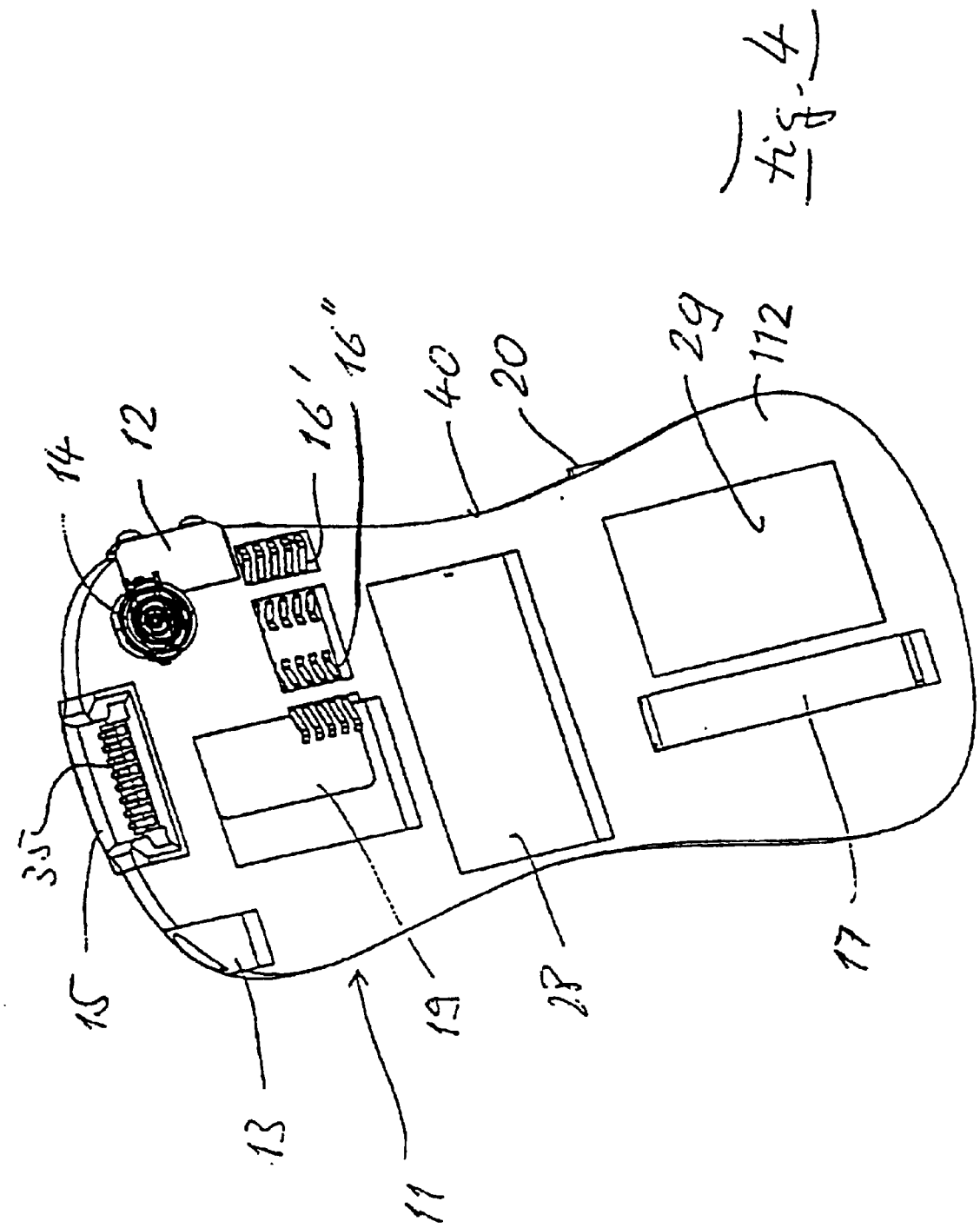
FIG. 4 is a bottom view of the carrier, circuit components, and smart cards of FIG. 3.

FIG. 1 shows the carrier 11, several circuit components that are to be fixed in place in the carrier, and two smart cards 19, 20 that can be temporarily installed in the carrier and then removed. The particular smart cards include a SIM type card 19, which has a thickness of about 0.8 mm, and which has an active face 100 with two rows of contact pads thereon that are connected to an integrated circuit that is embedded in the card. The other card 20 is an MMC card, which has a thickness of about 1 mm and which has a single row of contact pads 102 on an active face 104 of the card. The circuit components include a switch 12, a speaker 13 (FIG. 2), a plug connector 15 (FIG. 1), a contact comb strip 17 with electrical contacts 18 fixed or embedded therein, and two sets of SIM contacts 16 which are embedded in plastic of the carrier 11. An antenna connector part 14 connects to an antenna (not shown) that projects from the rest of the mobile phone.

The plate-shaped carrier has flat and parallel top and bottom faces 110, 112 and has a side edge 114, or periphery that forms substantially the entire periphery of the mobile telephone. That is, as seen in a plan view, the area within the carrier periphery 114 occupies at least 75% and preferably at least 90% of the entire area of the hand-held electronic device as seen in a top view of the device, especially when the components are mounted in the recesses. Only recesses such as 23 that extend completely through the carrier thickness and that open to the periphery 114 of the carrier subtract from the carrier area. The carrier has a plurality of recesses for receiving the various circuit components. These include a slot-like recess 22 in the periphery 114 for receiving the antenna connecting part 14, a through slot 23 in the periphery for receiving the microphone 13 (FIG. 2), through slots 26, 26' and 27 spaced from the periphery for receiving a card connector shown at 120 in FIG. 5, which has the contacts 16 shown in FIG. 1. The recesses also include a connector recess 25 for receiving the plug connector 15 and recess 29 for receiving the contact formed by the row of contact 18 and the comb strip 17. An additional recess is shown at 28 for receiving other components such as a speaker. The carrier has a card-passing slot 30 in its periphery for passing the MMC card 20, the slot having slot walls lying both above and below the slot. The carrier also has a shallow recess at 124 (a depth less than half the carrier thickness) in its periphery and its top face for receiving the SIM card 19.

All of the circuit components require electrical connections. This is generally provided by resilient sheet metal blades forming resilient terminals. The switch 12 has resilient blade terminals 130 and the SIM-engaging contacts 16 have blades 16', 16" with ends 36, 37, with one end of each contact positioned to engage a contact pad on the SIM card and the other end position to engage a circuit board trace. The plug 15 has spring contact blades 35 with projecting face ends, while the electrical contacts 18 have resilient ends 39 for engaging contact pads on the card and other ends 38 forming resilient blade terminals.

FIG. 5 shows that the circuit board 52 has numerous electrically conductive traces 140 for engaging the resilient blades of the various circuit components that are mounted in recesses of the carrier 11. Each of the resilient blade terminals on a circuit component project slightly beyond one of the faces such as 112 of the carrier. When the circuit board 52 is pressed facewise adjacent to the carrier face 112, the projecting resilient blades such as blade terminals 38 engage the corresponding circuit board traces 140. The various traces 140 are connected by elongated conductive trace conductors 142 on the circuit board to other electronic circuitry. Corresponding traces on the upper circuit board 51 can engage corresponding resilient blade ends on other electronic components. Where necessary, a header can be provided that connects traces on the two circuit boards 51 and 52.

The circuit components shown in FIG. 1, are attached or can be attached to the carrier 11 in a number of different ways. One way is to press fit the housing of a circuit component in a corresponding recess in the carrier 11, or hold its periphery with adhesive. This provides very secure holding of the component. Another way is for contacts to be molded into the carrier 11, or into a strip such as 17 that is press fit into a recess of the carrier.

The top and bottom casing shells shown in FIG. 5 at 53 and 56 are preferably of metal, to provide a barrier for electromagnetic interference. Applicant prefers to plate the side edge 114 of the carrier 11 with a metal layer which is connected to the metal of the top and bottom casing shells, to provide additional protection from electromagnetic interference.

Figure 6:
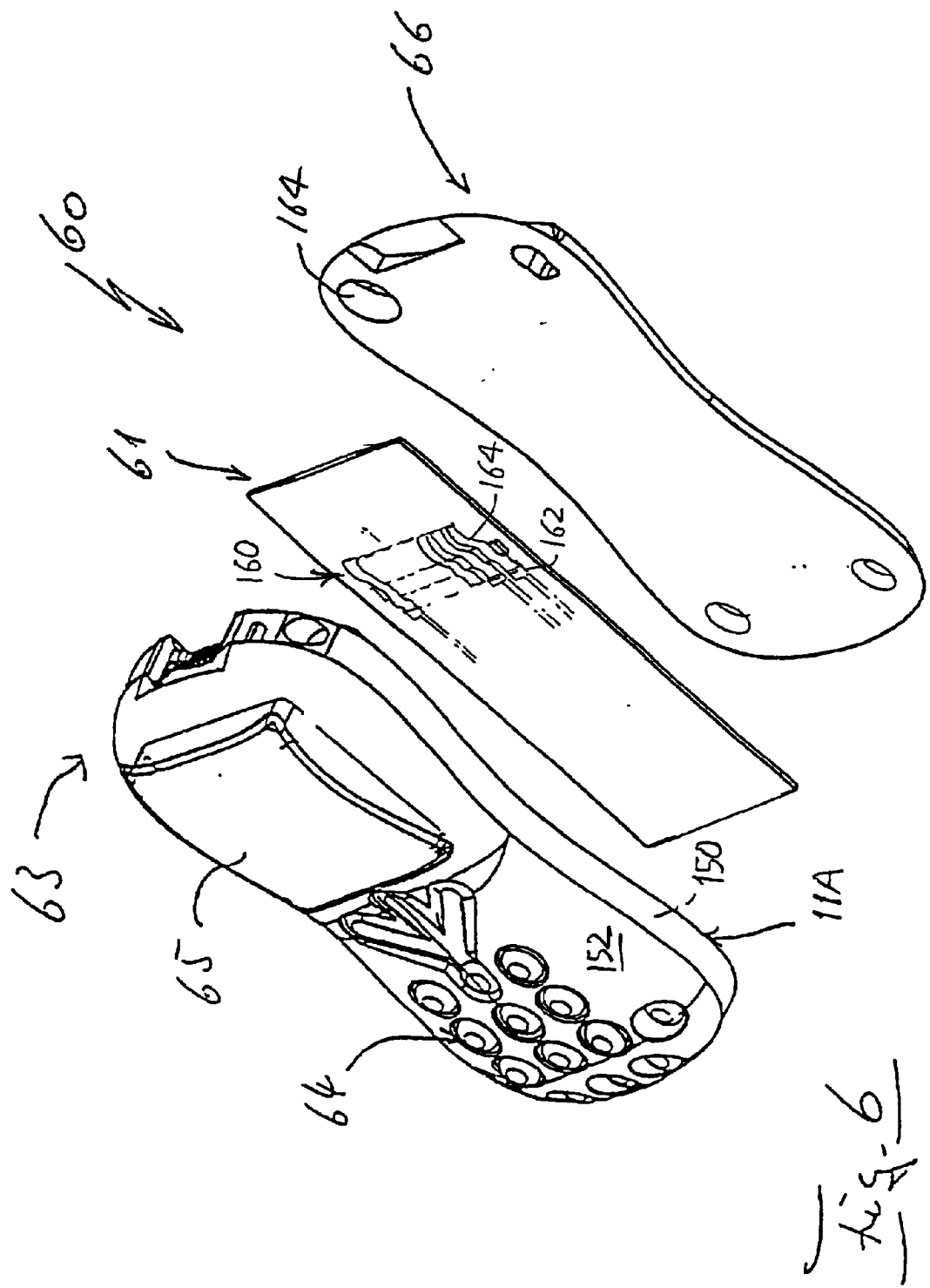
FIG. 6 is a top exploded isometric view of a hand-held electronic device of another embodiment of the invention.

FIG. 6 illustrates another mobile telephone 60 in which the carrier 11A is formed from a plate with a flat lower face 150 that can lie adjacent to a circuit board 61, and with an upper face 152 which is contoured to form the outline of a keyboard 64 and an area around the display window 65. The carrier 11A is similar to that of FIGS. 1–5 in that it has a plurality of recesses that receive components that are fixed in place, and with substantially all components connected by resilient blades to traces on the circuit board 61. Such components can include an LED or other display which is covered by the display window at 65. FIG. 6 shows terminals 160 fixed (e.g. by solder) to traces 162 on the circuit board, and having resilient blades 164 that engage fixed contacts of components that are fixed to the carrier 11A. Such terminals 160 are useful to connect to components that do not have resilient blades. Fasteners passing through holes 164 hold the parts together.

Although words such as "top", etc. have been used to describe the device as it is illustrated, it should be understood that the device can be used in any orientation.

Thus, the invention provides a hand-held electronic device with circuit components that are held in a protective manner and that can be connected to circuit board traces without requiring mass soldering. The device includes a carrier formed of insulative material and having a plurality of recesses. A plurality of electronic components are each mounted on the carrier and lie in the different recesses. Resilient contact blades connect terminals of the components to traces on the circuit board, the blades being deflected to provide pressure contact (with the traces or component rigid terminals) when the circuit board is moved facewise adjacent to the carrier. The carrier has a thickness at least twice that of the circuit board, with the thickness being more than 2 mm and preferably at least 3 mm. The carrier has a periphery or side edge which preferably follows the contour of the periphery of substantially the entire hand-held electronic device. The side edge of the carrier occupies more than 75% and preferably at least 90% of the area of the hand-held device as seen in a plan view.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A hand-held electronic device having a device upper face, a device bottom face, and a device periphery between said upper face and said bottom face, comprising:

a carrier formed of insulative material and having upper and lower carrier faces;

a plurality of circuit components mounted on said carrier;

said carrier having a plurality of recesses with each of said plurality of electronic components lying in and fixed in position in one of said recesses;

said carrier having a thickness of at least 2 mm between said carrier faces, said carrier having a carrier side edge extending in a closed loop, and said carrier having an area within said side edge that occupies at least 75% of the entire area of said electronic device within said device periphery as seen in a plan view taken from above said device upper face.

2. The device described in claim 1 wherein:

said plurality of recesses include a plurality of edge recesses formed in said side edge of said carrier, said edge recesses being open at the side edge of the carrier.

3. The device described in claim 1 wherein:

when said circuit components are mounted in said carrier, said carrier with said circuit components occupies at least 90% of the entire area of the electronic device as seen in a plan view.

4. The device described in claim 1 including:

a first circuit board having a thickness less than half the thickness of said carrier;

said first circuit board having a first face that lies facewise adjacent to a face of said carrier, said circuit board having a plurality of conductive traces on said first face, and including a plurality of resilient sheet metal blades that connect a first of said components to said conductive traces, said blades being resiliently deflected by said first circuit board being moved facewise adjacent to said carrier.

5. The device described in claim 1 including:

a first circuit board with a first face that lies facewise adjacent to a face of said carrier, said circuit board having a plurality of conductive traces on said first face, and at least a first plurality of said components each has a plurality of resilient sheet metal contacts with resilient tails that bear against said traces, said circuit board having a thickness less than half the thickness of said carrier.

6. The device described in claim 1 wherein:

said carrier has a card-passing slot for passing a smart card that has an active face with contact pads thereon, said card-passing slot extending from said side edge, said carrier having walls integral with the rest of said carrier and lying above and below said card-passing slot, to guide a card inserted into said slot;

one of said recesses is a card connector-holding recess that extends from said upper carrier face and that intersects said card-passing slot;

a card connector lying in said card connector-holding recess, said card connector including a plurality of sheet metal contacts with deflectable pad-engaging ends positioned in horizontal alignment with said card-passing slot to be deflected by a card inserted through said card passing slot.

7. The device described in claim 1 wherein:

a majority of said side edge of said carrier is metal plated.

8. The device described in claim 4 including:

a second circuit board with a second face that lies facewise adjacent to said carrier first face, said second circuit board having a plurality of conductive traces coupled to said components.

9. A hand-held electronic device comprising:

a carrier which is formed of a plate of insulative material, said carrier having first and second opposite carrier faces and a side edge;

said carrier having a plurality of recesses;

a plurality of circuit components each lying in one of said recesses and having resilient contact fingers projecting beyond said second face;

a first circuit board which has first and second opposite board faces, said first circuit board having a smaller thickness than said carrier, said board first face lying adjacent to said second carrier face and said board first face having a plurality of conductive traces thereon, said contact fingers engaging said traces.

10. The device described in claim 9 wherein:

said first and second carrier faces are respectively upper and lower faces;

said carrier has a card-receiving slot extending into said side edge, and one of said recesses extends through the thickness of said carrier and intersects said card-receiving slot.

11. The device described in claim 9 wherein:

a majority of said side edge of said carrier is coated with a metal plating.

12. The device described in claim 9 wherein:

said carrier has a thickness of at least three millimeters between said first and second carrier faces.

13. A hand-held electronic device that includes an electronic circuit, and that has a periphery, comprising:

a carrier formed of a plate of insulative material having a thickness of at least 2 mm and having upper and lower faces, said carrier having about the same periphery as said electronic device, and said carrier having a plurality of recesses;

a plurality of circuit components of said electronic circuit each fixed in position in one of said recesses, each of said circuit components having a plurality of terminals;

a circuit board having a plurality of conductive traces and having a first face lying facewise adjacent to one of said carrier faces;

means for connecting said terminals of said circuit components to said traces, including deflected resilient contact blades.

14. The device described In claim 13 wherein:

said resilient contact blades are permanently fixed to said circuit components and resiliently press against said traces.

* * * * *